(12) United States Patent
VanDorp

(10) Patent No.: US 11,350,526 B2
(45) Date of Patent: May 31, 2022

(54) REVERSIBLE ELECTRONIC CARD AND METHOD OF IMPLEMENTATION THEREOF

(71) Applicant: GE Aviation Systems, LLC, Grand Rapids, MI (US)

(72) Inventor: Jeffrey A. VanDorp, Grand Rapids, MI (US)

(73) Assignee: GE Aviation Systems, LLC, Grand Rapids, MI (US)

( * ) Notice: Subject to any disclaimer, the term of this patent is extended or adjusted under 35 U.S.C. 154(b) by 0 days.

(21) Appl. No.: 16/586,811

(22) Filed: Sep. 27, 2019

(65) Prior Publication Data

US 2021/0100096 A1 Apr. 1, 2021

(51) Int. Cl.
| | |
|---|---|
| H05K 1/11 | (2006.01) |
| H01R 43/02 | (2006.01) |
| H05K 1/18 | (2006.01) |
| H05K 3/28 | (2006.01) |
| H05K 3/34 | (2006.01) |

(52) U.S. Cl.
CPC .......... *H05K 1/113* (2013.01); *H01R 43/0256* (2013.01); *H05K 1/181* (2013.01); *H05K 3/28* (2013.01); *H05K 3/341* (2013.01); *H05K 2201/09672* (2013.01); *H05K 2201/09781* (2013.01); *H05K 2201/10189* (2013.01); *H05K 2203/041* (2013.01)

(58) Field of Classification Search
CPC .......... H05K 1/113; H05K 1/181; H05K 3/28; H05K 3/341; H05K 2201/09672; H01R 43/0256

USPC ........................................................ 174/260
See application file for complete search history.

(56) References Cited

U.S. PATENT DOCUMENTS

| | | |
|---|---|---|
| 8,398,412 B2 | 3/2013 | Dolhagaray |
| 9,035,848 B2 | 5/2015 | Infante |
| 10,397,678 B2 | 8/2019 | Rodrigues |
| 2003/0171035 A1 | 9/2003 | Yoo |
| 2006/0012395 A1* | 1/2006 | Huppenthal ........... H05K 1/181 |
| | | 326/41 |
| 2006/0086777 A1* | 4/2006 | Itoh ..................... B23K 3/0623 |
| | | 228/253 |
| 2016/0197417 A1 | 7/2016 | Busbee |
| 2017/0223440 A1 | 8/2017 | Rodrigues |
| 2017/0310100 A1 | 10/2017 | VanderKoy |
| 2018/0231932 A1 | 8/2018 | Minobe |
| 2020/0037448 A1* | 1/2020 | Kim ...................... H05K 1/117 |

FOREIGN PATENT DOCUMENTS

EP 3115853 A1 1/2017

* cited by examiner

*Primary Examiner* — Tremesha S Willis
(74) *Attorney, Agent, or Firm* — Wood IP LLC

(57) ABSTRACT

There is provided a method for implementing an electronic card. The method can include providing the electronic card with a printed circuit board. The method further includes selecting one of a first side and a second side as a specified side on which only connection hardware is to be mounted. The first side is located at a first x-y plane and the second side is located at a second x-y plane, the first and second x-y planes being separated by a length equal to a thickness of the PCB. The first and second x-y planes are parallel.

20 Claims, 4 Drawing Sheets

REVERSIBLE ELECTRONIC CARD AND METHOD OF IMPLEMENTATION THEREOF

I. TECHNICAL FIELD

The present disclosure relates to electronic cards, such as, for example and not by limitation, computer cards and switched mezzanine cards or the like. The present disclosure additionally relates to a method for implementing a reversible electronic card.

II. BACKGROUND

Electronic cards or computer cards are typically an assembly of electronic components that fit on a single or multi-layered PCB. An electronic card can include a connector that allows it to be mated with another carrier card (e.g., a mother board) in order to provide additional functionality to a larger system. Thermal management hardware are typically inserted between the electronic card and the carrier card to provide cooling. One issue encountered when using a typical electronic card is that it cannot be easily reused and integrated in a different product that has a different cooling strategy.

An example illustrating the aforementioned issue is a VITA 42.0-compliant mezzanine card. This type of card is typically designed such that the connectors are located on the hot side of the card. The mezzanine mounts via its connectors to a carrier card, and a heatsink is designed to fit between them to conduct heat out towards the sides of the module, typically to chassis walls that transfer heat externally to cooling air. If this same mezzanine card were to be used in a different chassis that did not have the same structure (i.e., walls on both sides), the cooling strategy would be more complex and costlier to design.

The ideal cooling strategy in that case might be to conduct heat from the hot side directly to the top cover of the chassis, but because the connector is fixed on the hot side, there is no mating connector to plug it in to other modules. As such, the design of typical electronic cards is inherently limiting, and it impedes re-use or versatility.

III. SUMMARY

The embodiments featured herein help solve or mitigate the above noted issues as well as other issues known in the art. For instance, an exemplary method as described below allows a manufacturer to develop a single computer card that can be integrated into a product using different thermal management strategies. A card designer may select one side of the card as the hot side and the other side as the cold side. The printed circuit board (PCB) is then designed and routed such that all the components are allocated to one of these sides, with the exception of the board-to-board connectors. Moreover, the PCB design can support the placement of these connectors on either side of the card.

The embodiments described herein feature several novel aspects in the electrical and mechanical implementation steps undertaken when designing and manufacturing a computer card, and they go beyond the steps involved in a typical computer card design or manufacturing flow. For example, and not by limitation, the embodiments feature novel signal routing methodologies, signal allocation, hole placement, and manufacturing processes that would not be employed as part of the design of a standard computer card that relies on a single thermal management approach. Two embodiments are summarized below.

In one embodiment, there is provided a method for implementing an electronic card. The method can include providing the electronic card with a printed circuit board. The method further includes selecting one of a first side and a second side as a specified side on which only connection hardware is to be mounted. The first side is located at a first x-y plane and the second side is located at a second x-y plane, the first and second x-y planes being separated by a length equal to a thickness of the PCB. The first and second x-y planes are parallel.

In another embodiment, there is provided an electronic card. The electronic card can include a PCB that comprises a first side and a second side. The PCB has a specified side selected from the first and second sides which is a side on which only connection hardware is mounted. The first side is located at a first x-y plane and the second side is located at a second x-y plane, and the first and second x-y planes are separated by a length equal to a thickness of the PCB. The first and second x-y planes are parallel. The PCB includes a first solder ball pattern disposed on a first surface on the first side and a second solder ball pattern disposed on a second surface of the second side. The first and second solder ball patterns are each a symmetric pattern. The first and second solder ball patterns have the same x and y coordinates on their respective x-y planes.

Additional features, modes of operations, advantages, and other aspects of various embodiments are described below with reference to the accompanying drawings. It is noted that the present disclosure is not limited to the specific embodiments described herein. These embodiments are presented for illustrative purposes only. Additional embodiments, or modifications of the embodiments disclosed, will be readily apparent to persons skilled in the relevant art(s) based on the teachings provided.

IV. BRIEF DESCRIPTION OF THE DRAWINGS

Illustrative embodiments may take form in various components and arrangements of components. Illustrative embodiments are shown in the accompanying drawings, throughout which like reference numerals may indicate corresponding or similar parts in the various drawings. The drawings are only for purposes of illustrating the embodiments and are not to be construed as limiting the disclosure. Given the following enabling description of the drawings, the novel aspects of the present disclosure should become evident to a person of ordinary skill in the relevant art(s).

V. DETAILED DESCRIPTION

While the illustrative embodiments are described herein for particular applications, it should be understood that the present disclosure is not limited thereto. Those skilled in the art and with access to the teachings provided herein will recognize additional applications, modifications, and embodiments within the scope thereof and additional fields in which the present disclosure would be of significant utility.

Figure 1:
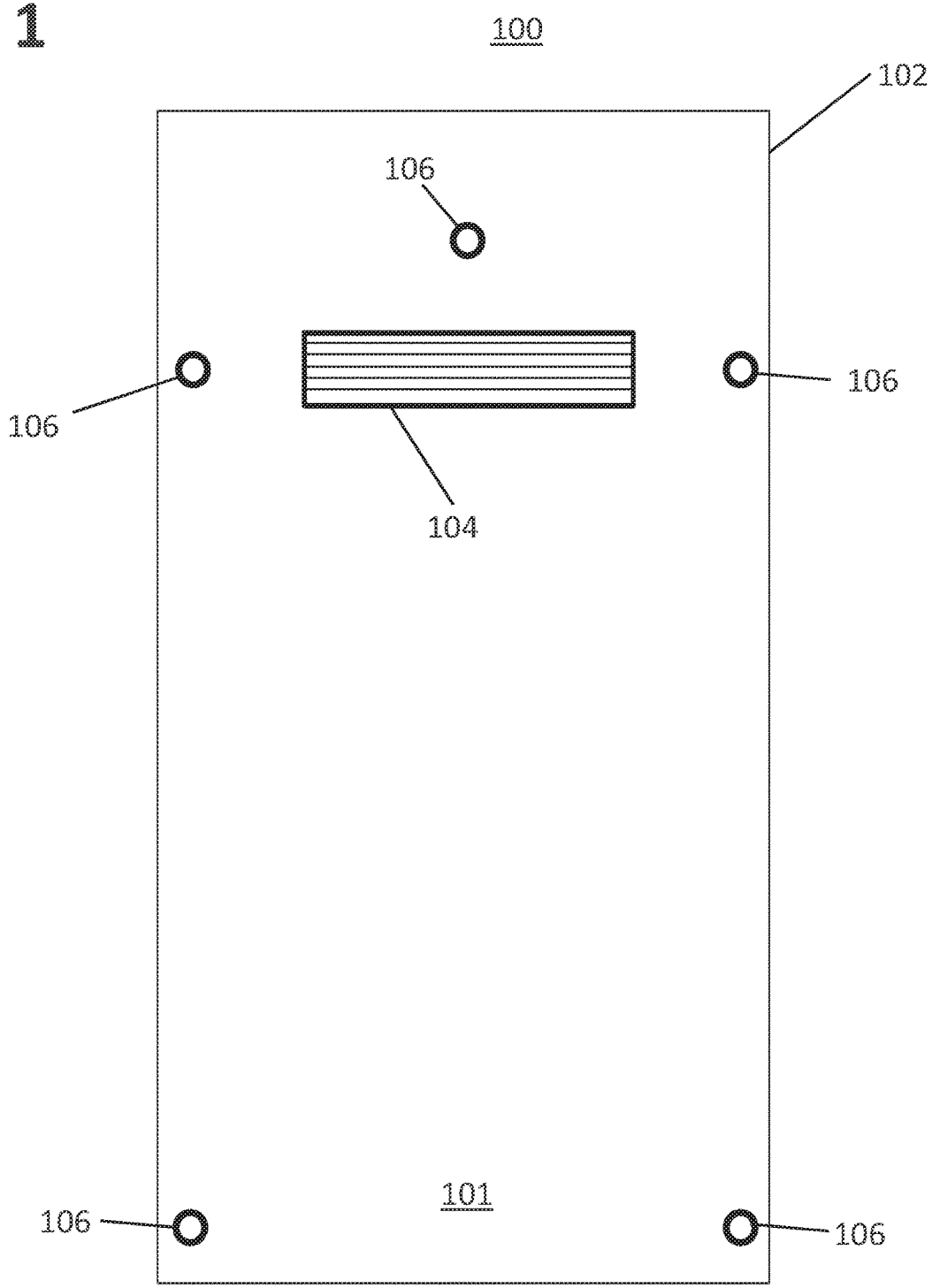
FIG. 1 illustrates a view of an electronic card according to an embodiment.

FIG. 1 illustrates a view 100 of an electronic card 102, according to an embodiment. The electronic card 102 can include a cold side 101 on which there is mounted a connector 104. The electronic card 102 can further include a set of features 106 configured to support the electronic card 102 on a carrier card when it is mated with the carrier card via the connector 104. As shown in FIG. 1, the connector 104 is mounted on the cold side 101, and only connection hardware such as the connector 104 is mounted on the cold side 101. Without loss of generality, only the connector 104 is shown. However, it should be understood that a plurality of connectors like the connector 104 may be mounted on the cold side 101.

Figure 2:
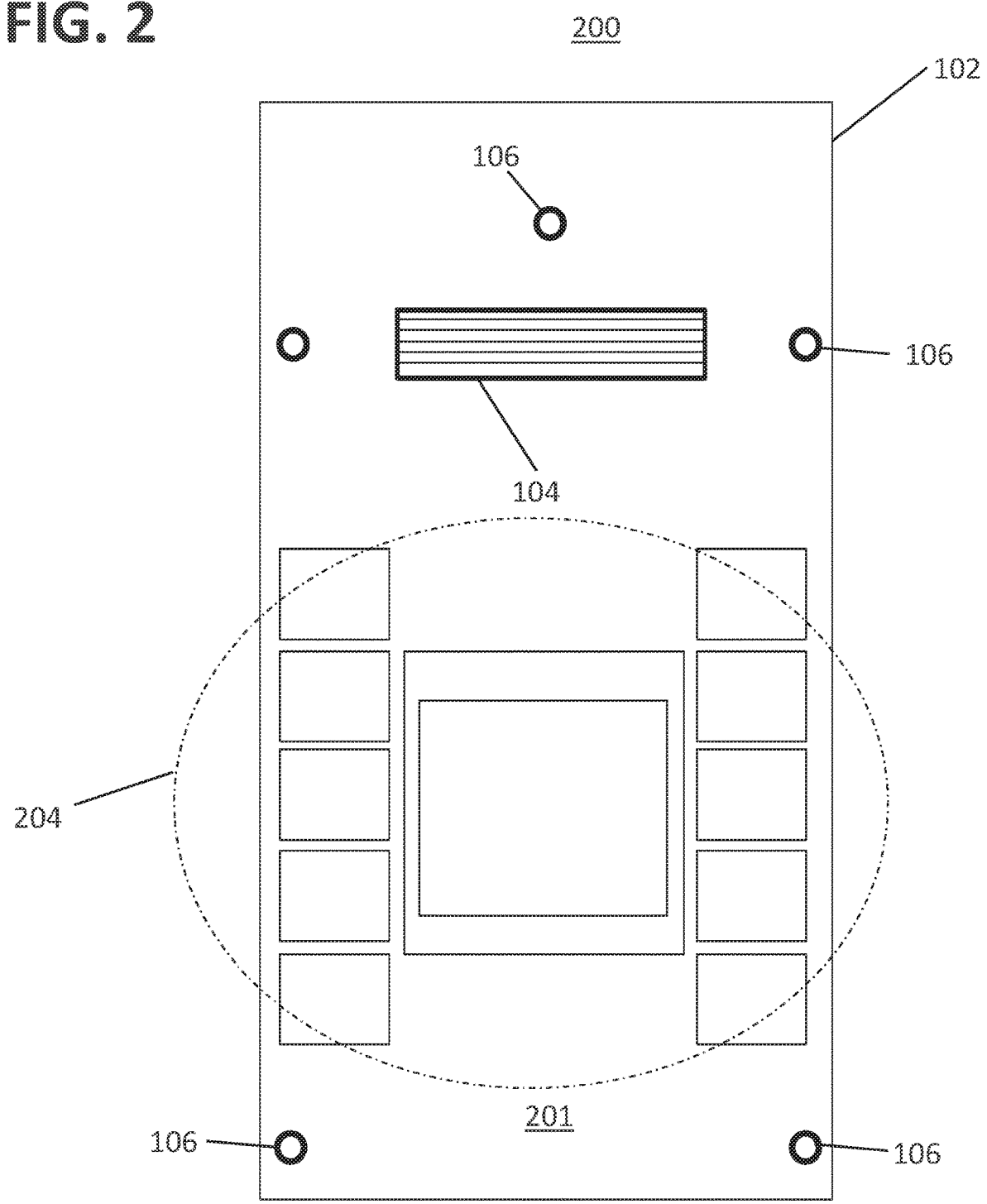
FIG. 2 illustrates a view of an electronic card according to an embodiment.

Generally, in the view 100, the cold side 101 is reserved for connection hardware, and the hot side (i.e., the side opposite to the cold side 101) is reserved for functional components, which may be electronic chips and elements (e.g., capacitors, inductors, resistors, etc.) that cooperatively function to provide one or more functionalities to the electronic card 102. Furthermore, the hot side of the electronic card 102, while being reserved for functional components, also includes a solder pattern and conductivity for mounting a connector 104 should the electronic card 102 be used in a product where the thermal management strategy dictates that the electronic card 102 be mated from the hot side to a carrier board. As such, as configured, the electronic 102 is versatile and can accommodate different thermal management strategies. For example, FIG. 2 illustrates a view 200 of another implementation of the electronic card 102 in which the connector 104 is mounted on the hot side 201 where there are disposed a set of functional components 204.

Figure 3:
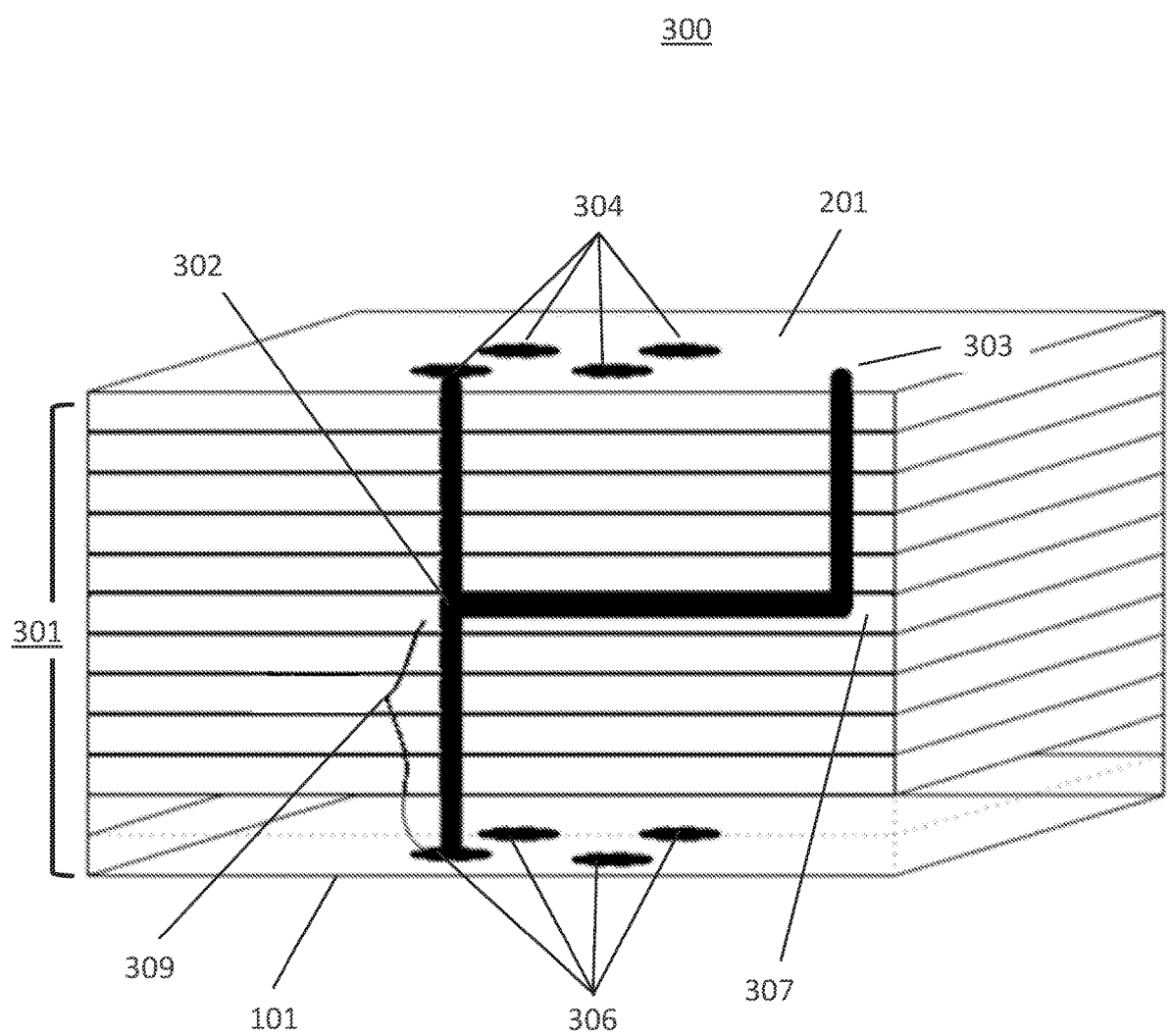
FIG. 3 illustrates a view of an electronic card according to an embodiment.

FIG. 3 illustrates a view 300 showing a cross-section of the electronic card 102 with an exemplary signal routing network 302 and solder ball patterns 304 and 306 for mounting the connector 104 on either the cold side 101 or the hot side 201. The electronic card 102 can include a multi-layered PCB 301 of a predetermined thickness, which may be used to route a plurality of signals. As configured, the cold side 101 and the hot side 201 form two surfaces each occupying an x-y plane, where the planes are separated by the predetermined thickness of the PCB 301 and where the planes are parallel.

Each solder ball pattern (304 and 306) is symmetric. Furthermore, when considering a coordinate system common to each of the two x-y planes, the solder ball pattern 304 and the solder ball pattern 306 have the same set of x-y coordinates. Furthermore, the signal routing network 302 can include a route to a middle layer 307 win which there's branch 303 that goes to either the cold side 101 or the hot side 201, depending on which side has been designated for including the functional components. Furthermore, one or more stubs 309 may be left on the PCB 301 as a result of not soldering a connector on an unused side. The length of the stubs 309 may be minimized, i.e., the stubs 309 may have their lengths set such that they are below a predetermined length parameter.

Figure 4:
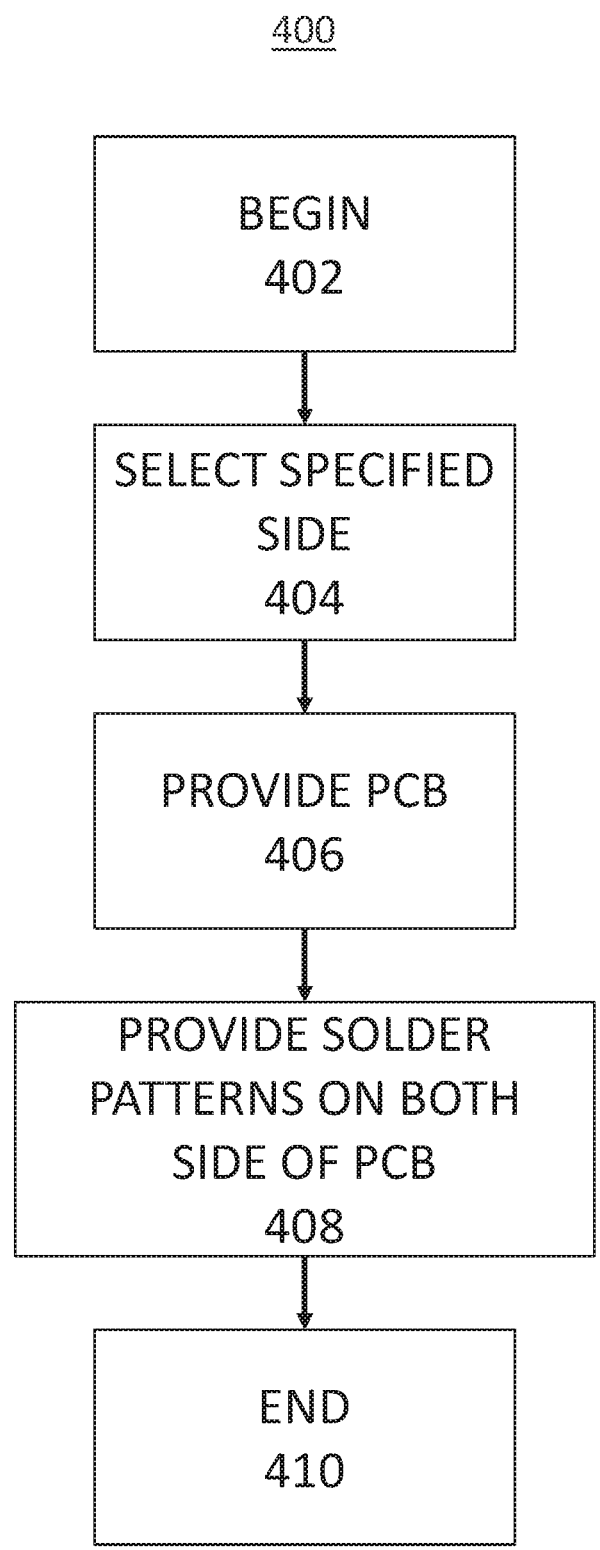
FIG. 4 illustrates a method according to an embodiment.

FIG. 4 illustrates a flow chart for a method 400 for implementing the electronic card 102 as described above. The method 400 begins at step 402 and can include providing the electronic card 102 with a printed circuit board 301. (Step 404). The method 400 further includes selecting one of a first side and a second side as a specified side on which only connection hardware is to be mounted. (Step 406) The first side is located at a first x-y plane and the second side is located at a second x-y plane, the first and second x-y planes being separated by a length equal to a thickness of the PCB. The first and second x-y planes are parallel.

The method 400 further includes providing a first solder ball pattern on the first side and a second solder ball pattern on the second side. (Step 408). The first and second solder ball patterns are each a symmetric pattern. The first and second solder ball patterns have the same x and y coordinates on their respective x-y planes. The method 400 can end at step 410.

Generally, a method according to the embodiments feature herein can include designating one of the first and second sides as a hot side and the other one of the first and second side as a cold side. The method can further include designating the specified side as the cold side. The method can further include designating the specified side as the hot side. Furthermore, the method can include mounting a connector on the specified side.

The method can include encapsulating an unused solder pattern on an unused side, the unused side being a side other than the specified side. Furthermore, the method can include making a stub of an unused solder pattern on an unused side shorter than a predetermined length, the unused side being a side other than the specified side. The method further includes routing a signal on a middle layer of the multi-layered PCB. The method further includes branching the signal using a through via to a first pad on the first side and to a second pad on the second side.

Still, generally, an embodiment according to the teachings presented herein can include a reversible electronic card. The electronic card can include a PCB that comprises a first side and a second side. The PCB has a specified side selected from the first and second sides which is a side on which only connection hardware is mounted. The first side is located at a first x-y plane and the second side is located at a second x-y plane, and the first and second x-y planes are separated by a length equal to a thickness of the PCB. The first and second x-y planes are parallel. The PCB includes a first solder ball pattern disposed on a first surface on the first side and a second solder ball pattern disposed on a second surface of the second side. The first and second solder ball patterns are each a symmetric pattern. The first and second solder ball patterns have the same x and y coordinates on their respective x-y planes.

The PCB can be a multi-layered PCB, and the electronic card can be a switched mezzanine card. The electronic card can include a signal trace routed to a middle layer of the multi-layered PCB, and it can include a branch of the signal with a through via to a first pad on the first side and to a second pad on the second side. The specified side includes a connector mounted thereon, and the opposite side to the specified side includes one or more functional components.

Generally, an embodiment featured herein can include a method for implementing a reversible electronic card. This method allows reuse of a card in different cooling strategies by selecting connector(s) with particular characteristics and designing specific features into a PCB included in the electronic card. The method includes designating or selecting a side of the card as a "hot side" and an opposite side of the card as a "cold side." The method further includes selecting a connector based on a set of criteria that includes selecting solder balls or through-hole pins. The solder balls may be arranged in a symmetrical pattern such that a connector may be rotated 180 degrees around either an x-axis or a y-axis, and still be able to be attached to the same printed circuit board footprint.

The method further includes providing alignment pins that are offset from each other in the x and y dimensions such that when rotated either around the x dimension or the y dimension, there is no interference with the alignment holes.

As such, in the exemplary method described above, a PCB may feature solder pads on both sides of the PCB to match the connector footprint. The solder pads may be located at the same point on the X-Y plane on both the "top" and the "bottom" surface of the PCB. Signals may be routed to both surfaces (top and bottom), such that each signal is connected to a pair of pads.

Furthermore, the stubs left on the PCB as a result of not soldering a connector on an unused side may have their lengths minimized, i.e., they may have their lengths set such that they are below a predetermined length parameter. Furthermore, in yet another embodiment, the stubs may be zero-ohm resistors, and their length may be minimized such that they are below a predetermined length parameter. Without limitation but by example, the predetermined length parameter may be about 50 mils.

In the exemplary PCB, the routing of a signal may be achieved by routing the signal on one of the middle layers of a multi-layer PCB, and branching the signal using through vias to the pads on both surfaces. The PCB may include drill holes for alignment pins such that when the connector is rotated 180 degrees around both the X and Y axes, the solder ball pattern will align on either surface.

In the exemplary PCB, pin identifiers may be rotated depending on which side the connector is placed. As such, in the exemplary implementation, supporting design documentation such as schematics and pinout lists reflect both options, and at manufacture, a particular pinout is identified as valid, depending on which side the connector will be mounted. Furthermore, unused connector pads on a surface without a connector can be covered with a non-conductive coating material in order to prevent inadvertent shorting of signals.

Those skilled in the relevant art(s) will appreciate that various adaptations and modifications of the embodiments described above can be configured without departing from the scope and spirit of the disclosure. Therefore, it is to be understood that, within the scope of the appended claims, the disclosure may be practiced other than as specifically described herein.

What is claimed is:

1. A method for implementing an electronic card, the method comprising:
   providing the electronic card with a printed circuit board (PCB) including a first side and a second side, wherein only one of the first and second side is a specified side on which only connection hardware is to be mounted;
   wherein when the one side is the specified side, the other of the first and second sides includes functional components mounted thereon;
   wherein the first side is located at a first x-y plane and the second side is located at a second x-y plane, the first and second x-y planes being separated by a length equal to a thickness of the PCB;
   wherein the first and second x-y planes are parallel;
   providing a first solder ball pattern on the first side and a second solder ball pattern on the second side;
      wherein the first and second solder ball patterns are each a symmetric pattern; and
      wherein the first and second solder ball patterns have the same x and y coordinates on their respective x-y planes, and
   wherein the electronic card is reversible such that a signal routed on an intermediate layer of the PCB is accessible with a through via to a first pad on the first side and with the through via to a second pad on the second side.

2. The method of claim 1, wherein providing the electronic card with the PCB includes providing a multi-layered PCB.

3. The method of claim 1, wherein providing the electronic card with the PCB includes providing a switched mezzanine card.

4. The method of claim 3, wherein providing the providing the electronic card with the PCB includes providing the switched mezzanine card with a multi-layered PCB.

5. The method of claim 1, further including mounting a connector on the specified side.

6. The method of claim 5, further including encapsulating an unused solder pattern on an unused side, the unused side being a side other than the specified side.

7. The method of claim 5, further including making a stub of an unused solder pattern on an unused side shorter than a predetermined length, the unused side being a side other than the specified side.

8. The method of claim 2, further including routing a signal on a middle layer of the multi-layered PCB.

9. The method of claim 8, further including branching the signal using a through via to a first pad on the first side and to a second pad on the second side.

10. An electronic card, comprising:
    a printed circuit board (PCB) including a first side and a second side, wherein a specified side selected from the first and second sides is a side on which only connection hardware is mounted, wherein the first side is located at first x-y plane and the second side is located at a second x-y plane, the first and second x-y planes being separated by a length equal to a thickness of the PCB, and wherein the first and second x-y planes are parallel;
    wherein when the one side is the specified side, the other of the first and second sides includes functional components mounted thereon;
    a first solder ball pattern disposed on a first surface on the first side and a second solder ball pattern disposed on a second surface of the second side;
       wherein the first and second solder ball patterns are each a symmetric pattern; and
       wherein the first and second solder ball patterns have the same x and y coordinates on their respective x-y planes; and
    wherein the electronic card is reversible such that a signal routed on an intermediate layer of the PCB is accessible with a through via to a first pad on the first side and with the through via to a second pad on the second side.

11. The electronic card of claim 10, wherein the PCB is a multi-layered PCB.

12. The electronic card of claim 10, wherein the electronic card is a switched mezzanine card.

13. The electronic card of claim 12, wherein the PCB is a multi-layered PCB.

14. The electronic card of claim 13, further including a signal trace routed to a middle layer of the multi-layered PCB.

15. The electronic card of claim 10, wherein the specified side includes a connector mounted thereon.

16. The electronic card of claim 15, wherein an opposite side to the specified side includes one or more functional components.

17. The method of claim 1, wherein the specified side is a hot side relative to the other side.

18. The electronic card of claim 10, wherein the specified side is a hot side relative to the other side.

19. The method of claim 1, wherein the first and second solder ball patterns each present the symmetric pattern such that if the electronic card is reversed a presented first solder ball pattern on the first side is identical to a presented second solder ball pattern on the second side.

20. The electronic card of claim 10, wherein the first and second solder ball patterns each present the symmetric pattern such that if the electronic card is reversed a presented first solder ball pattern on the first side is identical to a presented second solder ball pattern on the second side.

\* \* \* \* \*